(12) United States Patent
Gao et al.

(10) Patent No.: US 9,442,367 B2
(45) Date of Patent: Sep. 13, 2016

(54) ARRAY SUBSTRATE AND MASK PLATE

(71) Applicant: BEIJING BOE OPTOELECTRONICS TECHNOLOGY CO., LTD., Beijing (CN)

(72) Inventors: Xiang Gao, Beijing (CN); Sung Hun Song, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 185 days.

(21) Appl. No.: 13/704,820

(22) PCT Filed: Oct. 30, 2012

(86) PCT No.: PCT/CN2012/083765
§ 371 (c)(1),
(2) Date: Dec. 17, 2012

(87) PCT Pub. No.: WO2013/075574
PCT Pub. Date: May 30, 2013

(65) Prior Publication Data
US 2014/0076615 A1   Mar. 20, 2014

(30) Foreign Application Priority Data

Nov. 22, 2011   (CN) .................... 2011 2 0467808 U

(51) Int. Cl.
*G02F 1/1343*   (2006.01)
*G03F 1/50*   (2012.01)
(Continued)

(52) U.S. Cl.
CPC ............ *G03F 1/50* (2013.01); *G02F 1/133707* (2013.01); *G02F 1/134309* (2013.01); *H05K 1/0274* (2013.01)

(58) Field of Classification Search
CPC ............ G03F 1/14; G03F 1/144; G03F 1/42; G02F 1/503; G02F 1/133707; G02F 1/134309; H05K 1/0274
USPC ............................................ 430/5; 349/141
See application file for complete search history.

(56) References Cited

U.S. PATENT DOCUMENTS

| | | |
|---|---|---|
| 2003/0043336 A1 | 3/2003 | Sasaki et al. |
| 2004/0229138 A1* | 11/2004 | Ki et al. ........................... 430/5 |

(Continued)

FOREIGN PATENT DOCUMENTS

| | | |
|---|---|---|
| CN | 1403859 A | 3/2003 |
| CN | 101324750 A | 12/2008 |

(Continued)

OTHER PUBLICATIONS

International Search Report dated Feb. 7, 2013, PCT/CN2012/083765.

(Continued)

*Primary Examiner* — Nathanael R Briggs
(74) *Attorney, Agent, or Firm* — Ladas & Parry LLP

(57) ABSTRACT

Embodiments of the disclosed technology provide an array substrate. The array substrate comprises: a plurality of electrode patterns with a predetermined shape being subsequently arranged in a predetermined direction, every two adjacent electrode patterns having a slit therebetween; a preset width of all or a part of the plurality of electrode patterns in the predetermined direction is different from a standard width of electrode pattern. The embodiments of the invention further provide a mask plate.

4 Claims, 3 Drawing Sheets

(51) Int. Cl.
*H05K 1/02* (2006.01)
*G02F 1/1337* (2006.01)

(56) References Cited

U.S. PATENT DOCUMENTS

2005/0255390 A1* 11/2005 Lai et al. .......................... 430/5
2008/0020294 A1* 1/2008 Yao .......................... G03F 1/14
  430/5
2008/0076039 A1* 3/2008 Ishii .......................... G03F 1/30
  430/5
2010/0055401 A1 3/2010 Choi et al.

FOREIGN PATENT DOCUMENTS

| CN | 101542323 A | 9/2009 |
| CN | 202383394 A | 8/2012 |
| JP | 2010-169750 A | 8/2010 |

OTHER PUBLICATIONS

International Preliminary Report on Patentability dated May 27, 2014; PCT/CN2012/083765.

* cited by examiner

US 9,442,367 B2

ARRAY SUBSTRATE AND MASK PLATE

FIELD OF THE ART

Embodiments of the invention relate to an array substrate and a mask plate.

BACKGROUND

An Advanced Super Dimension Switching (ADS) liquid crystal display (LCD) is used to increase light transmittance of the LCD device across a plane. A multi-dimensional electric field is formed with both an electric field produced at edges of slit electrodes in the same plane and an electric field produced between a slit electrode layer and a plate-like electrode layer, so that liquid crystal molecules at all orientations, which are located directly above the electrodes and between the slit electrodes in a liquid crystal cell, can be rotated, which enhances the work efficiency of liquid crystals and increases the light transmittance. The Advanced Super Dimensional Switching technology can improve the picture quality of thin film transistor liquid crystal displays (TFT-LCDs) and has advantages of high transmittance, wide viewing angle, high aperture ratio, low chromatic aberration, being free of push Mura, etc.

Specific explanations are provided as follows. A LCD of ADS mode comprises an array substrate, a color filter substrate, and a liquid crystal layer interposed therebetween. Each pixel region is defined on an array substrate by a gate line and a data line which are formed to intersect with each other, and a switching device is disposed at an intersection of the gate line and the data line. The pixel region comprises a first transparent electrode and a second transparent electrode, wherein the second transparent electrode is a slit-like electrode, and the first transparent electrode and the second transparent electrode are separated from each other by an insulating layer. The first transparent electrode together with the second transparent electrode produces an electrical field that effects on liquid crystal molecules in a liquid crystal layer, thereby controlling the light transparency and forming a high-quality picture.

The electrical field for smoothly acting on the liquid crystal molecules in the liquid crystal layer is suitably generated at a boundary region between a slit and an elongated strip of the second transparent electrode by the LCD of ADS mode. Upon being etched, the strip of the second transparent electrode requires to approximately keep at a standard value of 4 μm, so that the light transmittance can be well controlled, and undesired visual effects, such as pictures with over-brightness, too large chromatic aberration, and etc., can be avoided as much as possible.

Currently, the slit and the elongated strip in the second transparent electrode can be obtained by a patterning process on the second transparent electrode, which is specifically as follows:

1) forming a layer of transparent electrode film on an array substrate;

2) applying photoresist on the transparent electrode film;

3) disposing a mask plate (comprising a light-transmitting portion and a light-blocking portion) over the substrate obtained in the step 2) and exposing, so that a portion of the photoresist is irradiated and denaturized;

4) developing the substrate, and then removing the portion of the photoresist;

5) etching the substrate, and then removing the portion of the transparent electrode film not being protected by the photoresist, thus a pattern is achieved. In an example of using positive photoresist, the portion of the photoresist which is irradiated by the light is denaturized and removed during the developing; the transparent electrode film under the photoresist not being irradiated is not etched so as to remain. Therefore, as for the second transparent electrode, the slit corresponds to the light-transmitting portion of the mask plate, and the elongated strip corresponds to the light-blocking portion of the mask plate. If negative photoresist is used, the positions corresponding to the light-transmitting portion and the light-blocking portion are reversed.

By taking positive photoresist as an example, an exposure process is performed on the second transparent electrode through a mask plate which has a configuration as shown in FIG. 1 and comprises elongated strips 11 and slits 12. The second transparent electrode is formed with a configuration as shown in FIG. 1 after other patterning processes, which comprises elongated strips with a width of 4 μm, and slits with a width of 6 μm.

However, the inventor found that over etching or inadequate etching may appear when the second transparent electrode is patterned by a patterning process in a prior art, due to some of the following reasons: instable controlling of light-exposure quantity, instable conditions for developing, inaccurate etching time, variation in concentration of the etching liquid, etc. As a result, the width of the elongated trips of the second transparent electrode cannot maintain at around 4 μm, which will lead to an excessive off-set from a standard width of elongated strip of the second transparent electrode, so that the obtained light transmittance may not be good. Referring to FIG. 1, for instance, it shows a shape and size of an electrode pattern in an existing array substrate (which corresponds to the shape and size of an electrode pattern of the mask plate being used), wherein the electrode pattern comprises elongated strips with a width of 4 μm and slits with a width of 6 μm. Provided that over exposing occurs during exposing, too much photoresist will be removed. In this case, the transparent electrode film under no protection is etched, which leads to an over etching phenomenon, i.e., the width of the elongated strips of the second transparent electrode is smaller than 4 μm; otherwise, the width of the elongated strips is greater than 4 μm.

SUMMARY

An embodiment of the invention provides an array substrate. The array substrate comprises: a plurality of electrode patterns with a predetermined shape being subsequently arranged in a predetermined direction, every two adjacent electrode patterns having a slit therebetween; a preset width of all or a part of the plurality of electrode patterns in the predetermined direction is different from a standard width of electrode pattern.

Another embodiment of the invention provides a mask plate. The mask plate comprises: a plurality of light-blocking portions with a predetermined shape being subsequently arranged in a predetermined direction, every two adjacent light-blocking portions having a light-transmitting portion therebetween; a preset width of all or a part of the plurality of light-blocking portions in the predetermined direction is different from a standard width of light-blocking portion.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides an array substrate, and a preset width of all or a part of a plurality of transparent electrode films on the array substrate is different from a standard width of transparent electrode film. In this case, it is possible to ensure that the width of all or a part of the transparent electrode films which are subjected to a patterning process including exposure and etching can be kept at the standard width approximately.

In this specification, the standard width of transparent electrode film refers to an ideal width which is desired for the transparent electrode film in a final product. Moreover, a slit between the transparent electrode films also has a standard width of slit, which refers to an ideal width which is desired for the slit in a final product. For instance, in one example, a standard width of transparent electrode film can be 4 μm, and a standard width of slit can be 6 μm. However, the embodiments of the invention does not limited to the above mentioned standard widths.

First Embodiment

The embodiment of the invention provides an array substrate, comprising: a plurality of electrode patterns with a predetermined shape being subsequently arranged in a predetermined direction, every two adjacent electrode patterns having a slit therebetween; a preset width of all or a part of the plurality of electrode patterns in the predetermined direction is different from a standard width of electrode pattern.

The electrode patterns and the slits are alternately disposed along the above determined direction. Except for the last transparent electrode film among the plurality of transparent electrode films, a sum of the preset width of each electrode pattern and the preset width of the slit next to the electrode pattern in the predetermined direction is equal to a sum of the standard width of electrode pattern and a standard width of slit. The predetermined shape of the transparent electrode films can be circular, rectangular, etc. For purpose of convenience, a transparent electrode film with a rectangular shape is described herein as an example.

EXAMPLE 1

Figure 1:
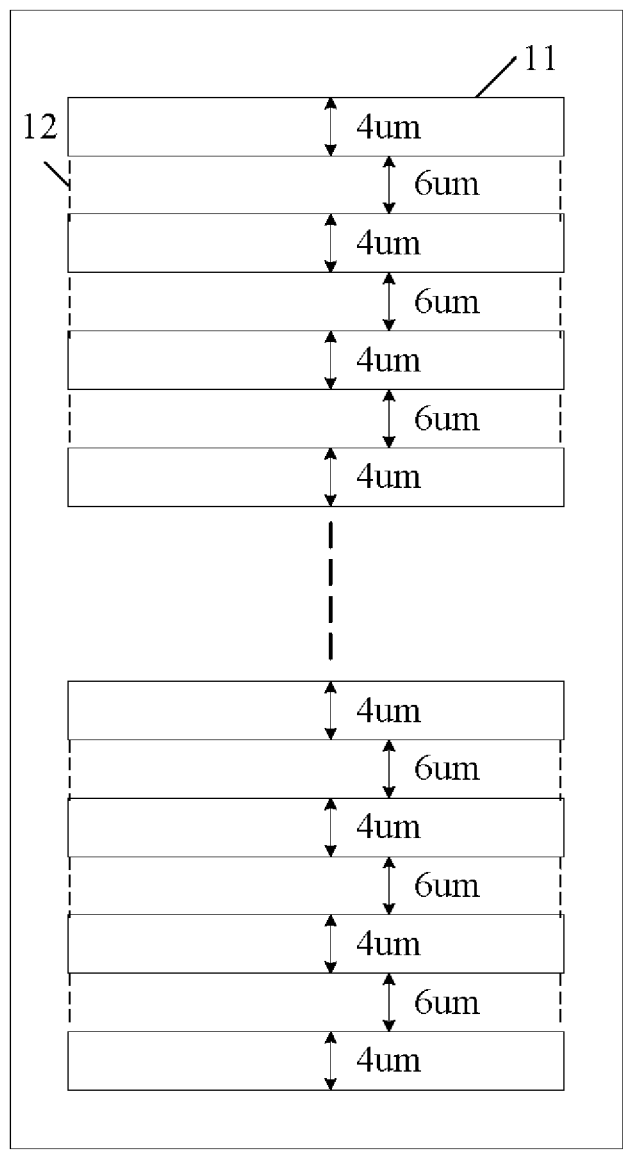
FIG. 1 schematically illustrates a configuration of an existing array substrate.
Figure 2:
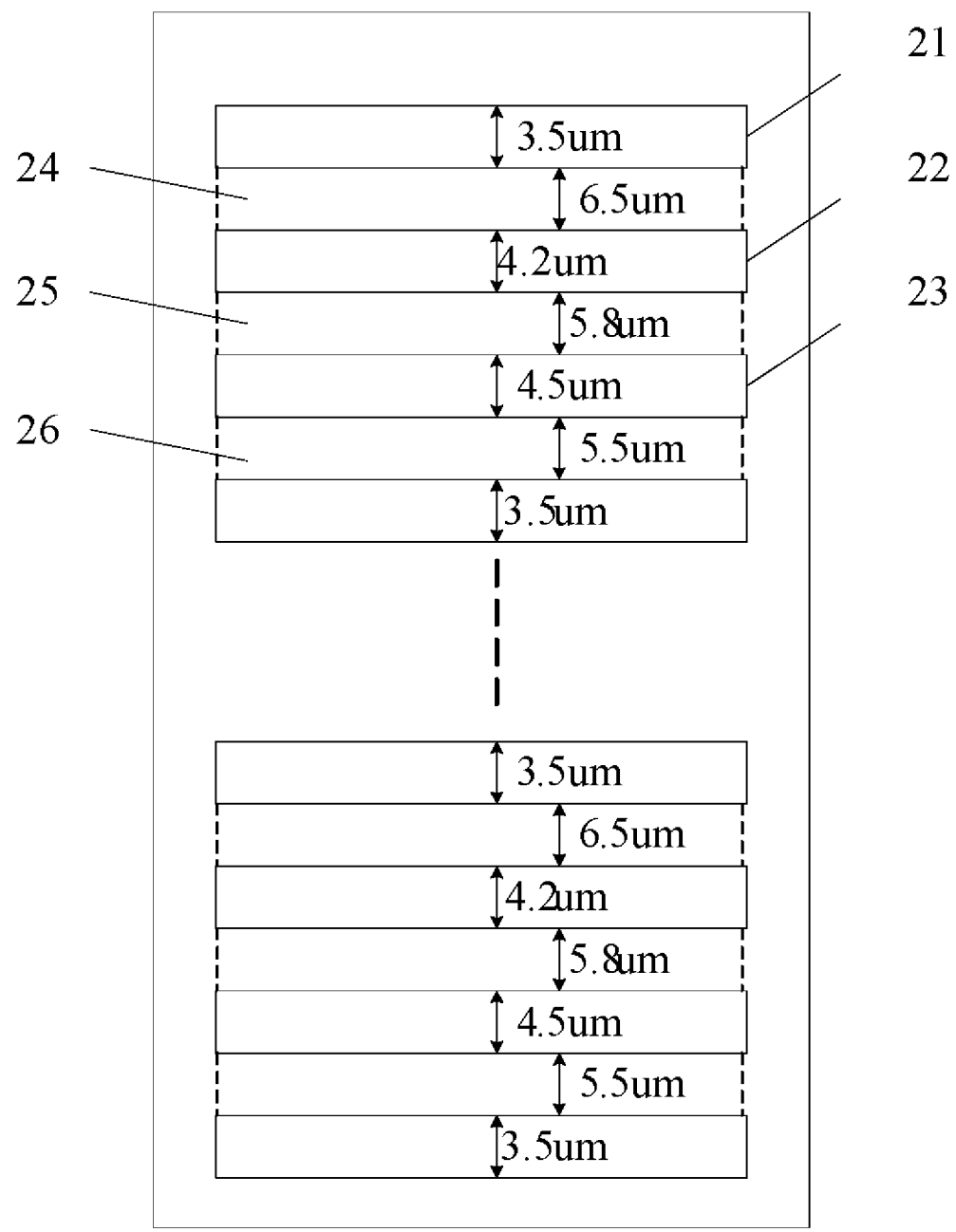
FIG. 2 schematically illustrates a first configuration of an array substrate in accordance with an embodiment of the invention.

As shown in FIG. 2, a first rectangular transparent electrode film 21 has a preset width of 3.5 μm, and a first slit 24 has a preset width of 6.5 μm; a second rectangular transparent electrode film 22 has a preset width of 4.2 μm, and a second slit 25 has a preset width of 5.8 μm; a third rectangular transparent electrode film 23 has a preset value of 4.5 μm, and a third slit 26 has a preset width of 5.5 μm. The first rectangular transparent electrode film 21, the first slit 24, the second rectangular transparent electrode film 22, the second slit 25, the third rectangular transparent electrode film 23 and the third slit 26 can be repeatedly and regularly arranged in the way as shown in FIG. 2. The array substrate with such a configuration ensures that the width of the rectangular transparent electrode films in some regions, namely, the width of the rectangular transparent electrode films after being subjected to the etching process, is kept at the standard width of 4 μm approximately, thereby reducing over etching or inadequate etching by a large extent and decreasing influence on visual effect as much as possible.

EXAMPLE 2

Figure 3:
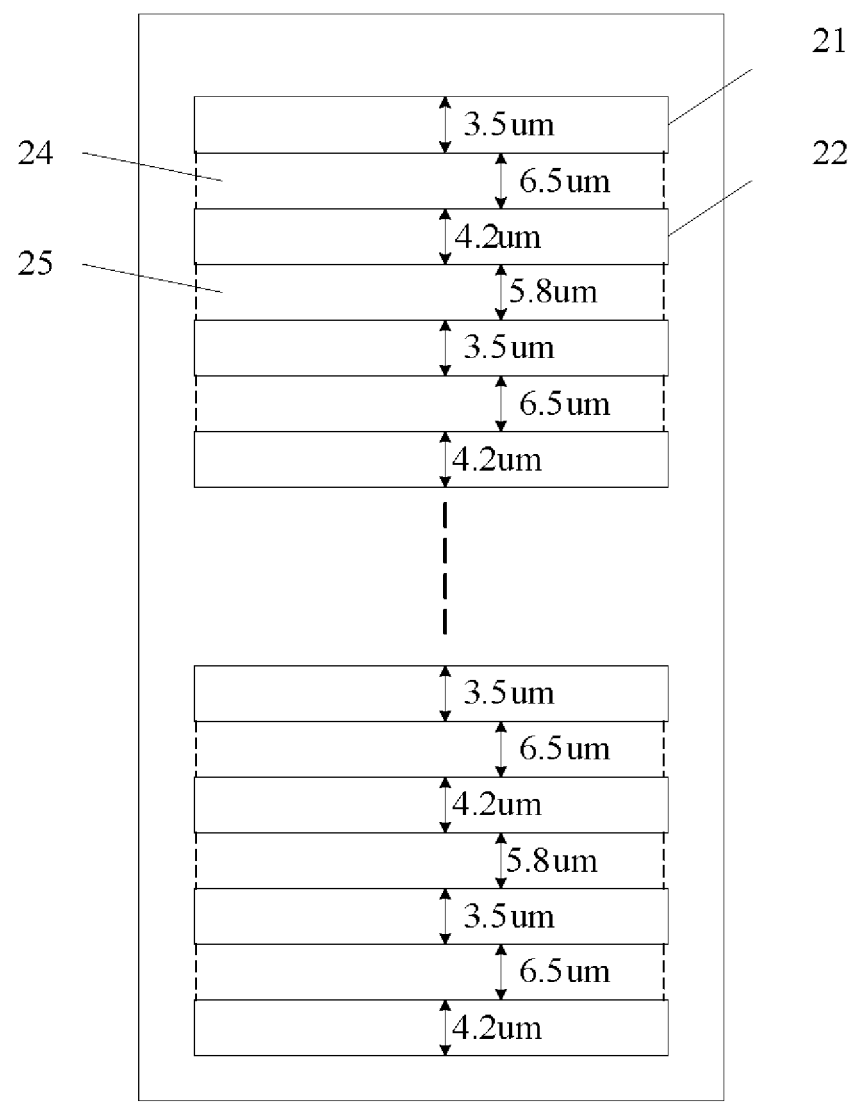
FIG. 3 schematically illustrates a second configuration of an array substrate in accordance with an embodiment of the invention.

As shown in FIG. 3, a first rectangular transparent electrode film 21 has a preset width of 3.5 μm, and a first slit 24 has a preset width of 6.5 μm; a second rectangular transparent electrode film 22 has a preset width of 4.2 μm, and a second slit 25 has a preset width of 5.8 μm. The first rectangular transparent electrode film 21, the first slit 24, the second rectangular transparent electrode film 22, and the second slit 25 can be repeatedly and regularly arranged in the way as shown in FIG. 3. The array substrate with such a configuration ensures that the width of the rectangular transparent electrode films in some regions, namely, the width of the rectangular transparent electrode films after being subjected to the etching process, is kept at the standard width of 4 μm approximately, thereby reducing over etching or inadequate etching by a large extent and decreasing influence on visual effect as much as possible.

EXAMPLE 3

In the arrangement direction of the transparent electrode films, a first rectangular transparent electrode film has a width of 3.5 μm, and a first slit has a width of 6.5 μm; a second rectangular transparent electrode film has a preset width of 4.5 μm, and a second slit has a width of 5.5 μm. The first rectangular transparent electrode film, the first slit, the second rectangular transparent electrode film, and the second slit can be repeatedly arranged. The array substrate with such a configuration ensures that the width of the rectangular transparent electrode films in some regions, namely, the width of the rectangular transparent electrode films after being subjected to the etching process, is kept at the standard width of 4 μm approximately, thereby reducing over etching or inadequate etching by a large extent and decreasing influence on visual effect as much as possible.

It can be seen from FIG. 2 that every three rectangular transparent electrode films constitute a group (e.g., 21, 22, and 23 in FIG. 2). In the rectangular transparent electrode film group, the preset width of the transparent electrode pattern gradually increases. A part of the transparent conductive films (e.g. the transparent conductive film 21) have a present width less than the standard width, while another part of the transparent conductive films (e.g., 22 and 23) have a preset width greater than the standard width. Thus, when a design is performed according to the above preset widths, if the over etching or inadequate etching problems appear after the patterning step of exposure and etching, at least a part of the transparent conductive films have a width equal to the standard width.

As for FIG. 3, except that every two rectangular transparent electrode films constitute a group, it adopts similar deigns in other aspects with that in FIG. 2, so repeated description is omitted here. However, the number of the transparent electrode films in each transparent electrode film group is not limited to two or three, but can be any suitable number more than two.

Further, the above description is made by taking the patterns of the transparent conductive film as an example. However, the embodiments of the invention can be applied to a variety of transparent or opaque electrode patterns.

In above embodiments, the preset width of the electrode patterns is set to be greater or smaller than the standard width. For instance, the difference between the preset width of the electrode pattern and the standard width of electrode pattern is 20% of the standard width of electrode pattern or less.

The embodiments of the invention provide an array substrate on which a plurality of transparent electrode films (electrode patterns) are arranged, and the preset width of all or a part of the transparent electrode films in the plurality of transparent electrode films is different from the standard width of electrode pattern. Such a design in size can ensure that the width of the rectangular transparent electrode films after being etched is kept at the standard width approximately, thereby reducing over etching or inadequate etching by a large extent and decreasing influence on visual effect as much as possible.

Second Embodiment

During manufacture of the above electrode patterns, it is necessary to conduct a patterning process. In consideration of the off-set in exposure and etching processes (over etching or inadequate etching), the mask plate for exposing can be designed in such a way that a width of patterns therein is different from a standard width of mask plate pattern in order to enable all or a part of the resultant electrode patterns have a width equal to a standard width. For instance, in the case adopting positive photoresist, a light-blocking portion of the mask plate will correspond to the electrode pattern portion, while a light-transmitting portion of the mask plate will correspond to the slit portion between the electrode patterns. Therefore, a standard width of the light-blocking portion of the mask plate will correspond to a standard width of electrode pattern (not necessarily equal to each other), and a standard width of the light-transmitting portion of the mask plate will correspond to a standard width of slit (not necessarily equal to each other). For this purpose, an embodiment of the present invention provides a mask plate.

The mask plate comprises: a plurality of light-blocking portions with a predetermined shape being subsequently arranged in a predetermined direction, every two adjacent light-blocking portions having a light-transmitting portion therebetween; a preset width of all or a part of the plurality of light-blocking portions in the predetermined direction is different from a standard width of light-blocking portion.

In one embodiment, the above predetermined shape is rectangular.

In one embodiment, along the above predetermined direction, the light-blocking portions and the light-transmitting portions are alternately disposed. Except for the last light-blocking portion among the plurality of light-blocking portions, a sum of the width of each light-blocking portion and the width of the light-transmitting portion next to the light-blocking portion in the predetermined direction is equal to a sum of the standard width of light-blocking portion and a standard width of light-transmitting portion.

In one embodiment, every two or more light-blocking portions constitute a light-blocking portion group, in which the width of the light-blocking portions gradually increases, and the width of a part of the light-blocking portions in the group is less than the standard width of light-blocking portion, the width of another part of the light-blocking portions is greater than the standard width of light-blocking portion, and a plurality of light-blocking portion groups are subsequently arranged in the predetermined direction.

In one embodiment, the difference between the width of the light-blocking portion and the standard width of light-blocking portion is 20% of the standard width of light-blocking portion or less.

In addition, the aforementioned mask plate can also be applied in the case adopting negative photoresist.

It should be appreciated for those skilled in the art that embodiments of the invention can be provided as a method, a system, or a computer program product. Thus, the invention can be embodied in form of pure hardware, pure software, or combination thereof. Furthermore, the invention may also he embodied in form of computer program products that are executed in a computer accessible memory media (including but not limit to disc memory, CD-ROM, and optical memory) that contains computer accessible program codes.

What is claimed is:

1. A mask plate, comprising:
a plurality of light-blocking portions with a predetermined shape being subsequently arranged in a predetermined direction, every two adjacent light-blocking portions having a light-transmitting portion therebetween; a preset width of a part of the plurality of light-blocking portions in the predetermined direction is different from a standard width of light-blocking portion, and the standard width being identical to a width of at least one light-blocking portions, wherein the difference between the width of the part of the plurality of light-blocking portions and the standard width is 20% of the standard width or less,
wherein the light-blocking portions and the light-transmitting portions are alternately disposed along the predetermined direction, for all of the light-blocking portions except the last light-blocking portion among the plurality of light-blocking portions, a sum of the width of each light-blocking portion and the width of the light-transmitting portion next to the light-blocking portion in the predetermined direction is equal to a sum of the standard width of light-blocking portion and a standard width of light-transmitting portion.

2. The mask plate according to claim 1, wherein the predetermined shape is rectangular.

3. The mask plate according to claim 2, wherein every two or more light-blocking portions constitute a light-blocking portion group, in which the width of the light-blocking portions gradually increases, and the width of a part of the light-blocking portions in the group is less than the standard width of light-blocking portion, the width of another part of the light-blocking portions is greater than the standard width of light-blocking portion, and a plurality of light-blocking portion groups are subsequently arranged in the predetermined direction.

4. The mask plate according to claim 1, wherein the difference between the width of the part of the plurality of light-blocking portions and the standard width is 5% of the standard width or more.

* * * * *